United States Patent

Kushiyama

[19]

[11] Patent Number: 5,933,028
[45] Date of Patent: Aug. 3, 1999

[54] DATA TRANSMITTER CIRCUIT AND SEMICONDUCTOR DEVICE USING THE SAME

[75] Inventor: Natsuki Kushiyama, Yokohama, Japan

[73] Assignee: Kabushiki Kaisha Toshiba, Kawasaki, Japan

[21] Appl. No.: 08/970,110

[22] Filed: Nov. 13, 1997

[30] Foreign Application Priority Data

Nov. 13, 1996 [JP] Japan .................................... 8-301745

[51] Int. Cl.⁶ .................. H03K 19/0175; H03K 19/094
[52] U.S. Cl. .............................. 326/83; 326/86; 326/68; 327/328; 327/333
[58] Field of Search ................................ 326/83, 86, 88, 326/17, 68, 80, 81, 121; 327/328, 333; 307/110

[56] References Cited

U.S. PATENT DOCUMENTS

| | | | |
|---|---|---|---|
| 4,040,015 | 8/1977 | Fukuda | 326/98 |
| 4,689,505 | 8/1987 | Ghoshal | 326/88 |
| 5,198,699 | 3/1993 | Hashimoto et al. | 326/121 |

*Primary Examiner*—Michael Tokar
*Assistant Examiner*—Daniel D. Chang
*Attorney, Agent, or Firm*—Banner & Witcoff, Ltd.

[57] ABSTRACT

A data transmitter circuit includes a reception line for receiving a logic signal made of a first logic signal and a second logic signal as a logic level opposite to the first logic signal, and an output circuit connected to a power supply potential and a ground potential to output one of the power supply potential and the ground potential when the logic signal received from the reception line is the first logic signal and output charges insulated from the power supply potential and the ground potential when the logic signal is the second logic signal.

19 Claims, 6 Drawing Sheets

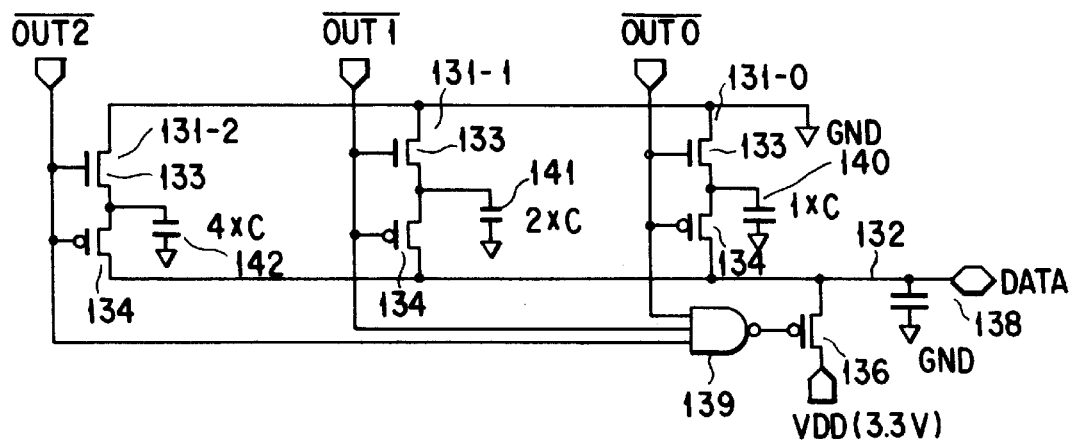
F I G. 11
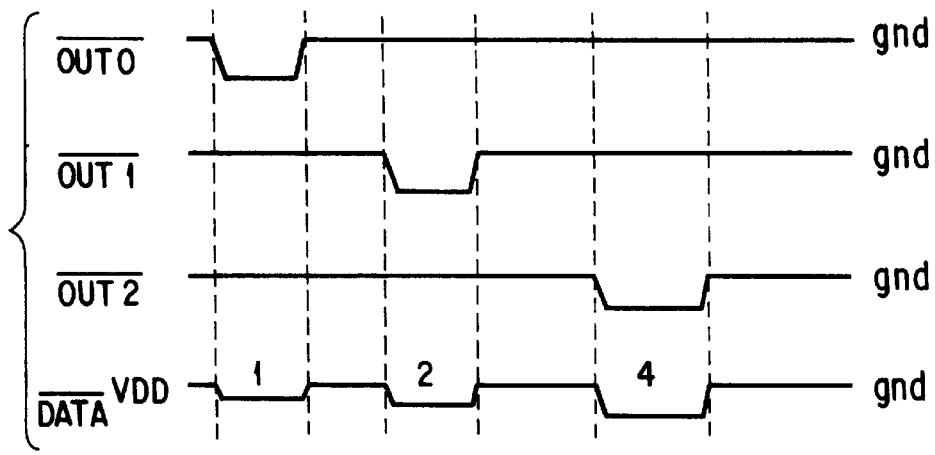
F I G. 12
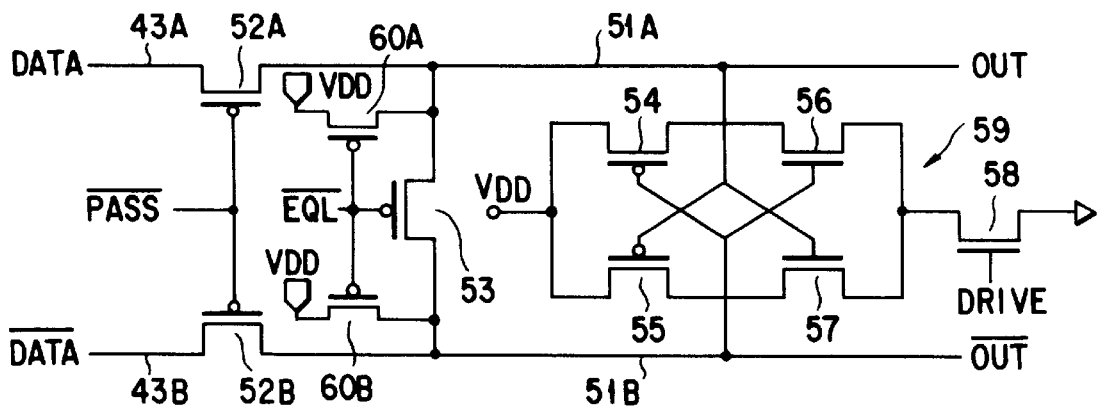
F I G. 14

DATA TRANSMITTER CIRCUIT AND SEMICONDUCTOR DEVICE USING THE SAME

BACKGROUND OF THE INVENTION

The present invention relates to a driving circuit for signal lines formed in a semiconductor integrated circuit.

In recent years, so-called logic hybrid memories in which a semiconductor memory device (to be referred to as a memory hereinafter) and a logic integrated circuit (to be referred to as a logic hereinafter) are integrated on one chip are becoming popular. The following advantages can be obtained by integrating a memory and a logic on one chip.

(1) The memory and the logic can be encapsulated in one package although they are conventionally independently encapsulated in packages. For this reason, the packaging cost can be reduced.

(2) Since no package leads, bonding wires, and interconnections on the printed circuit board are present between the memory and the logic, the operating frequency can be raised.

(3) As the number of packages to be arranged on the printed circuit board decreases, the area of the printed circuit board can be reduced.

(4) A large data bus width (the number of data lines connecting the memory and the logic) can be realized although it is physically impracticable in the conventional structure in which the memory and the logic are independently encapsulated in packages and connected on a printed circuit board.

Because of the above advantages, the logic hybrid memories are becoming popular in the field of, e.g., graphics ICs which require high-speed transfer of a large quantity of data between the memory and the logic.

Generally, the data transfer rate between the memory and the logic is represented by the product of the operating frequency of the data bus and the data bus width. As described above, since the data bus width can be relatively easily increased in the logic hybrid memory, the data bus width tends to be larger to raise the data transfer rate between the memory and the logic. In days when the data bus width was as small as 64 data lines, the power consumed by the data bus was negligible relative to the power consumption of the entire logic hybrid memory. However, the wider the data bus is, the larger the power consumption of the data bus becomes. It can be readily imagined that, in the near future, chips cannot be encapsulated in plastic packages poor in heat resistance because of heat generated by the power consumed by the data bus, or chips erroneously operate due to noise generated by the charge/discharge current of the data bus.

When the operating frequency is $f$ (Hz), the capacitance per data bus is C (F), and the amplitude (potential difference between "H" and "L") on the data bus is V (V), power P (W) consumed by the data bus is given by:

$$P = N \cdot f \cdot C \cdot V^2 \qquad (1)$$

To decrease the power consumption P, the data bus width (N) may be reduced, the capacitance (C) of the data bus may be decreased, or the amplitude (V) may be reduced.

However, since the data transfer rate is represented by the product of the data bus width (N) and the frequency (f), as described above, reduction of these values means degradation in data transfer capability. In addition, since the data bus capacitance (C) depending on the bus length is determined by layout, this value can hardly be made small. On the other hand, the amplitude on the data bus exponentially takes effect, so a very large power reduction effect can be obtained by decreasing the amplitude.

A known example of the logic hybrid memory having a small data bus amplitude is ""An Experimental 295 MHz CMOS 4K×256 SRAM Using Bidirectional Read/Write Shared Sense Amp and Self-Timed Pulsed Word-Line Drivers", in IEEE Journal of Solid-State Circuits, vol. 30, No. 11, November 1995" by the present inventor.

The static random access memory (SRAM) described in this paper has 256 pairs of complementary data buses. FIG. 18 shows an equivalent circuit of the data bus driving circuit of this SRAM. Reference symbol OUT denotes a signal for driving the output circuit of the DRAM. Reference numeral 71 denotes an inverter for inverting the signal OUT; 72 and 73, p-channel MOS transistors; and 74, a data bus. Reference numeral DATA denotes a signal output onto the data bus 74; VDD, a power supply (e.g., 3.3 V) for supplying the "H"-side potential of the data bus 74; and VDDL, a power supply (e.g., 3.0 V) for supplying the "L"-side potential of the data bus 74. Reference numeral 75 denotes a parasitic capacitance 75 of the data bus 74.

The operation of the data bus driving circuit having the above arrangement will be described next with reference to a timing chart shown in FIG. 19. When a signal of "H" is to be output to the data bus 74, the signal OUT is set at the potential VDD. At this time, one MOS transistor 72 is turned on, and the other MOS transistor 73 is turned off. The data bus 74 is connected to the power supply potential VDD and set at a potential of 3.3 V.

When a signal of "L" is to be output to the data bus 74, the signal OUT is set at the ground potential. At this time, one MOS transistor 72 is turned off, and the other MOS transistor 73 is turned on. The data bus 74 is connected to the power supply potential VDDL and set at a potential of 3.0 V. Therefore, the amplitude on the data bus 74 is 3.3 V–3.0 V=0.3 V.

In this SRAM, the amplitude on the data bus 74 is as small as 0.3 V. For this reason, the power consumption of the data bus is decreased to approximately 1/60 that of the conventional SRAM whose data bus has an amplitude of 3.3 V equal to the power supply voltage. In the conventional DRAM having a data bus amplitude of 3.3 V, the power P consumed by the data bus is given by:

$$P = N \cdot f \cdot C \cdot 3.3^2 = 10.89 N \cdot f \cdot C \qquad (2)$$

Since the SRAM described in this paper has complementary data buses, the number of data buses is N×2, and power P' consumed by all data buses is given by:

$$P' = 2 \times N \cdot f \cdot C \cdot 0.3^2 = 0.18 N \cdot f \cdot C \qquad (3)$$

The power consumption ratio is P:P'=60.5:1.

As is apparent from this evaluation result, when a small-amplitude data bus is used, power consumption of the data bus is largely decreased. However, in the SRAM described in the above paper, the intermediate power supply potential VDDL (3.0 V) on the "L" side of the data bus must be supplied from an external power supply.

In a general logic hybrid memory, the power supply voltage applied to the chip is 3.3 V or 5.0 V. It is cumbersome to independently prepare the power supply for the intermediate potential VDDL (3.0 V) for the "L"-side potential of the data bus, and additionally, the system cost increases.

In a general voltage drop circuit, a voltage drop is formed by dividing the power supply voltage by an appropriate resistor or the ON resistance of a transistor. In this scheme, however, some current must be flowed to the resistor or transistor to form the voltage drop, and the current is wastefully consumed by the resistor or transistor as Joule heat.

BRIEF SUMMARY OF THE INVENTION

It is an object of the present invention to provide a driving circuit and semiconductor integrated circuit capable of minimizing the amplitude on a signal line and reducing the chip size and current consumption of the integrated circuit.

According to the present invention, there is provided a data transmitter circuit comprising a reception line for receiving a logic signal comprising a first logic signal and a second logic signal as a logic level opposite to the first logic signal, and an output circuit connected to a power supply potential and a ground potential to output one of the power supply potential and the ground potential when the logic signal received from the reception line is the first logic signal and output charges insulated from the power supply potential and the ground potential when the logic signal is the second logic signal.

With the above arrangement of the present invention, the logic signal does not fully swing between, e.g., 3.3 V and 0 V, unlike the prior art. More specifically, when the logic signal swings between, e.g., 3.3 V and 3.0 V in accordance with the quantity of electricity of charges, the potential change amount is minimized. Since the potential change amount on the data bus is minimized, a fast information processing apparatus with minimum power consumption can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 11 is a circuit diagram showing a circuit arrangement according to the sixth embodiment in which a driving circuit of the present invention is used in a multivalued logic output circuit;

FIG. 12 is a timing chart showing the operation of the output circuit shown in FIG. 11;

FIG. 14 is a circuit diagram showing an arrangement example of the input circuit of the semiconductor integrated circuit of the embodiment shown in FIG. 13;

DETAILED DESCRIPTION OF THE INVENTION

The embodiments of the present invention will be described below with reference to the accompanying drawings.

Figure 1:
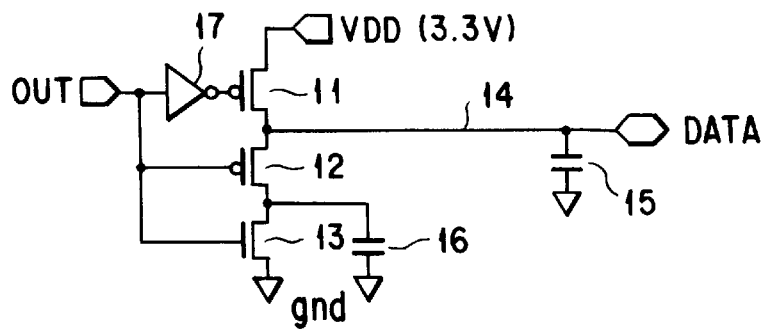
FIG. 1 is a circuit diagram showing a circuit arrangement according to the first embodiment in which a driving circuit of the present invention is used in the output circuit of an SRAM.

FIG. 1 shows a circuit arrangement according to the first embodiment in which a driving circuit of the present invention is used in the output circuit of an SRAM.

Referring to FIG. 1, a reference symbol VDD denotes a power supply (e.g., 3.3 V) for supplying the "H"-side potential of the data bus; and GND, a power supply of ground potential (0 V). The source-drain paths of two p-channel MOS transistors 11 and 12 and an n-channel MOS transistor 13 are connected in series between the power supply VDD and the power supply GND. A data bus 14 is connected to the series connection point of the MOS transistors 11 and 12. Reference numeral 15 denotes a parasitic capacitance of the data bus 14. One terminal of the parasitic capacitance 15 is connected to the power supply GND, and the other terminal is connected to the data bus 14. Reference numeral 16 denotes a dummy capacitance. One terminal of the dummy capacitance 16 is connected to the power supply GND, and the other terminal is connected to the series connection point of the MOS transistors 11 and 12. Note that the dummy capacitance 16 can be made using the gate capacitance, junction capacitance, or parasitic capacitance of metal interconnections of a MOS transistor.

In FIG. 1, reference symbol OUT denotes a signal for driving the output circuit of the SRAM. This signal OUT is supplied to the gates of the p-channel MOS transistor 12 and the n-channel MOS transistor 13 and simultaneously to an inverter 17. The output signal from the inverter 17 is supplied to the gate of the p-channel MOS transistor 11.

Figure 2:
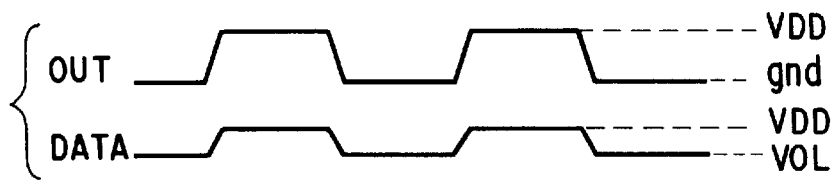
FIG. 2 is a timing chart showing the operation of the output circuit shown in FIG. 1.

The operation of the output circuit having the above arrangement will be described next with reference to a timing chart shown in FIG. 2. When a signal (DATA) of "H" is to be output to the data bus 14, the signal OUT is set at the potential VDD. At this time, the p-channel MOS transistor 11 is turned on to connect the data bus 14 to the power supply VDD, so that the data bus 14 is set at 3.3 V. Since the n-channel MOS transistor 13 is also turned on, the dummy capacitance 16 is connected to the power supply GND and completely discharged to 0 V.

When a signal (DATA) of "L" is to be output to the data bus 14, the signal OUT is set at the ground potential (GND). At this time, one p-channel MOS transistor 11 is turned off, the other p-channel MOS transistor 12 is turned on, and the n-channel MOS transistor 13 is turned off. The dummy capacitance 16 is connected to the data bus 14. Before the data bus 14 is connected to the dummy capacitance 16, the potential of the data bus 14 is VDD, and the parasitic capacitance 15 of the data bus 14 is also charged to VDD. On the other hand, the dummy capacitance 16 is discharged to 0 V. When the MOS transistor 12 is turned on, the capacitances 15 and 16 are connected to each other. Therefore, a potential VOL of the connected capacitances is given by equation (4) below in accordance with the rule of charge distribution:

$$VOL = VDD \times CBUS/(CBUS+Cdummy) \qquad (4)$$

where CBUS is the value of the parasitic capacitance 15, and Cdummy is the value of the dummy capacitance 16.

Assuming that CBUS is 1 pF, and Cdummy is 0.1 pF, i.e., the dummy capacitance 16 is roughly 1/10 the parasitic capacitance 15, equation (4) can be rewritten to equation (5):

$$VOL = 3.3 \times 1.0/(1.0+0.1) = 3.0 \qquad (5)$$

Regard VOL=3.0 V as the "L"-side potential of the data bus 14. Since the "H"-side potential is 3.3 V, and the "L"-side potential is 3.0 V, the data bus 14 has an amplitude of 0.3 V. When the value Cdummy of the dummy capacitance 16 is appropriately selected, the "L"-side potential VOL can be freely changed.

As described above, according to the first embodiment, the amplitude on the data bus can be made as small as, e.g., 0.3 V, so the power consumption of the data bus can be reduced.

The "L"-side potential of the data bus is formed by discharging the dummy capacitance 16 to 0 V in advance and then connecting the dummy capacitance 16 to the data bus 14. For this reason, neither an external power supply for supplying the "L"-side potential nor an internal voltage drop circuit is required. Consequently, the chip size and power consumption of an integrated circuit can be reduced.

Figure 3:
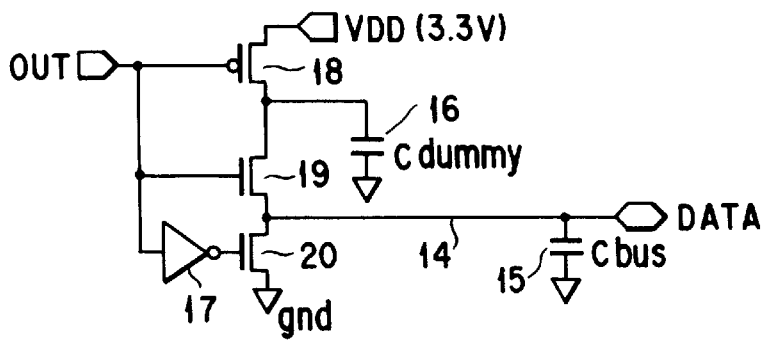
FIG. 3 is a circuit diagram showing a circuit arrangement according to the second embodiment in which a driving circuit of the present invention is used in the output circuit of an SRAM.

FIG. 3 shows a circuit arrangement according to the second embodiment in which a driving circuit of the present invention is used in the output circuit of an SRAM. The same reference numerals as in FIG. 1 denote the same parts in the output circuit of the second embodiment. In this embodiment, the source-drain paths of one p-channel MOS transistor 18 and two n-channel MOS transistors 19 and 20 are connected in series between a power supply VDD and a power supply GND. A data bus 14 is connected to the series connection point of the MOS transistors 19 and 20. A dummy capacitance 16 is connected to the series connection point of the MOS transistors 18 and 19.

A signal OUT is supplied to the gates of the p-channel MOS transistor 18 and the n-channel MOS transistor 19 and simultaneously to an inverter 17. The output signal from the inverter 17 is supplied to the gate of the n-channel MOS transistor 20.

Figure 4:
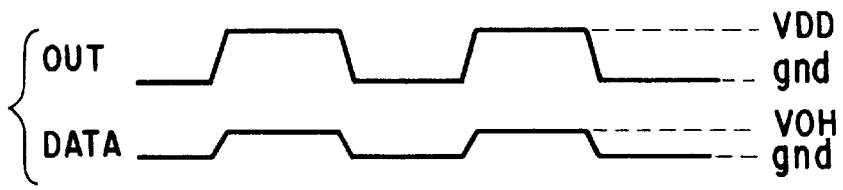
FIG. 4 is a timing chart showing the operation of the output circuit shown in FIG. 3.

The operation of the output circuit having the above arrangement will be described next with reference to a timing chart shown in FIG. 4. When a signal of "L" is to be output to the data bus 14, the signal OUT is set at the ground potential. At this time, the n-channel MOS transistor 20 is turned on. The data bus 14 is connected to the power supply GND of the ground potential, so the potential of the data bus 14 is 0 V. The n-channel MOS transistor 19 is turned off, and the p-channel MOS transistor 18 is turned on. The dummy capacitance 16 is connected to the power supply VDD and charged to VDD.

When a signal of "H" is to be output to the data bus 14, the signal OUT is set at the power supply potential (VDD). At this time, the p-channel MOS transistor 18 is turned off, the n-channel MOS transistor 19 is turned of, and the n-channel MOS transistor 20 is turned off. The dummy capacitance 16 is connected to the data bus 14. Before the dummy capacitance 16 is connected, the data bus 14 is at the power supply GND, i.e., 0 V, and a parasitic capacitance 15 of the data bus 14 is also discharged to 0 V. On the other hand, the dummy capacitance 16 is charged to VDD in advance. Since the two capacitances are connected to each other, a potential VOH of the connected capacitances is given by equation (6) in accordance with the rule of charge distribution:

$$VOH = VDD \times Cdummy/(CBUS+Cdummy) \qquad (6)$$

where CBUS is the value of the parasitic capacitance 15, and Cdummy is the value of the dummy capacitance 16.

Assuming that CBUS is 1 pF, and Cdummy is 0.1 pF, i.e., the dummy capacitance 16 is roughly 1/10 the parasitic capacitance 15, equation (6) can be rewritten to equation (7):

$$VOH = 3.3 \times 0.1/(1.0+0.1) \qquad (7)$$

Regard VOH=0.3 V as the "H"-side potential of the data bus 14. Since the "H"-side potential is 0.3 V, and the "L"-side potential is 0 V, the data bus 14 has an amplitude of 0.3 V. When the value Cdummy of the dummy capacitance 16 is appropriately selected, the "H"-side potential VOH can be freely changed.

In the second embodiment as well, the power consumption of the data bus can be reduced, and the chip size and power consumption of an integrated circuit can be reduced due to the same reason as in the first embodiment.

Figure 5:
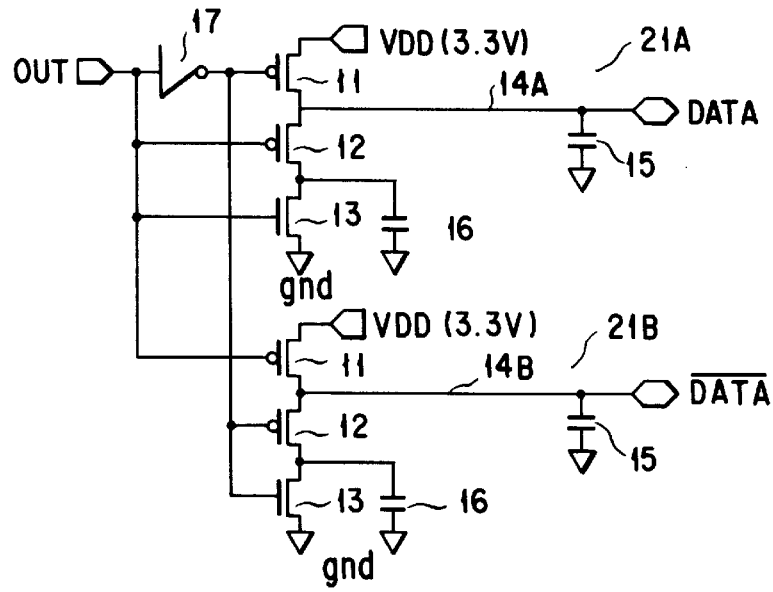
FIG. 5 is a circuit diagram showing a circuit arrangement according to the third embodiment in which a driving circuit of the present invention is used in the output circuit of an SRAM.

FIG. 5 shows a circuit arrangement according to the third embodiment in which a driving circuit of the present invention is used in the output circuit of an SRAM. The output circuit of this embodiment uses two output circuits according to the first embodiment shown in FIG. 1, and complementary signals DATA and $\overline{DATA}$ are output to a pair of data buses 14A and 14B, respectively.

More specifically, each of an output circuit 21A for driving one data bus 14A and an output circuit 21B for driving the other data bus 14B has two p-channel MOS transistors 11 and 12, an n-channel MOS transistor 13, and a dummy capacitance 16.

A signal OUT is supplied to the gates of the p-channel MOS transistor 12 and the n-channel MOS transistor 13 in the output circuit 21A and the gate of the p-channel MOS transistor 11 in the output circuit 21B, and simultaneously to an inverter 17. The output signal from the inverter 17 is supplied to the gate of the p-channel MOS transistor 11 in the output circuit 21A and the gates of the p-channel MOS transistor 12 and the n-channel MOS transistor 13 in the output circuit 21B.

Figure 6:
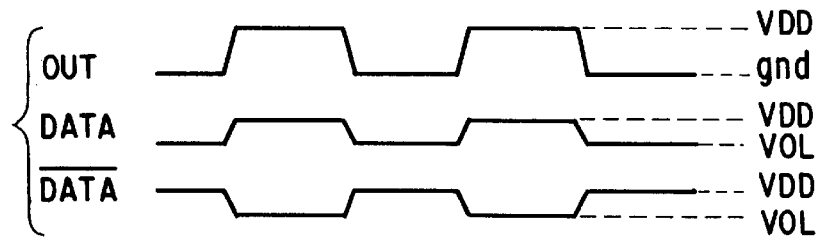
FIG. 6 is a timing chart showing the operation of the output circuit shown in FIG. 5.

The operation of the output circuit having the above arrangement will be described next with reference to a timing chart shown in FIG. 6.

When a signal of "H" is to be output to one data bus 14A, and a signal of "L" to the other data bus 14B, the signal OUT is set at a potential VDD. At this time, in the output circuit 21A, the p-channel MOS transistor 11 is turned on, as described in FIG. 1. The data bus 14A is connected to the power supply potential VDD, so the potential of the data bus 14A is 3.3 V. The dummy capacitance 16 in the output circuit 21A is completely discharged to 0 V. In the other output circuit 21B, the p-channel MOS transistor 12 is turned on. The dummy capacitance 16 discharged to the ground potential in advance is connected to the data bus 14B, so the potential of the data bus 14B is VOL given by equation (4).

When a signal of "L" is to be output to one data bus 14A, and a signal of "H" to the other data bus 14B, the signal OUT is set at the ground potential. At this time, in one output circuit 21A, the p-channel MOS transistor 12 is turned on. The dummy capacitance 16 discharged to the ground potential in advance is connected to the data bus 14A, so the potential of the data bus 14A is VOL given by equation (4). In the other data bus 14B, the p-channel MOS transistor 11 is turned on. The data bus 14B is connected to the power supply potential VDD, so the potential of the data bus 14B is 3.3 V.

Since the "H"-side potential is 3.3 V, and the "L"-side potential is 3.0 V, each of the data buses 14A and 14B has an amplitude of 0.3 V. When a value Cdummy of the dummy capacitance 16 is appropriately selected, the "L"-side potential VOL can be freely changed.

As described above, in the output circuit according to the third embodiment, complementary signals can be output to the pair of data buses 14A and 14B to reduce the amplitude of each data bus. For this reason, the power consumption of the data bus can be reduced. In addition, the chip size and power consumption of an integrated circuit can be reduced due to the same reason as in the first embodiment.

In the output circuit according to the third embodiment, two output circuits of the first embodiment shown in FIG. 1 are arranged to output complementary signals each having an amplitude between VDD and VOL to the pair of data buses 14A and 14B. Instead, two output circuits each having an amplitude between GND and VOH, as shown in FIG. 3, may be arranged to output complementary signals to the pair of data buses 14A and 14B.

Figure 7:
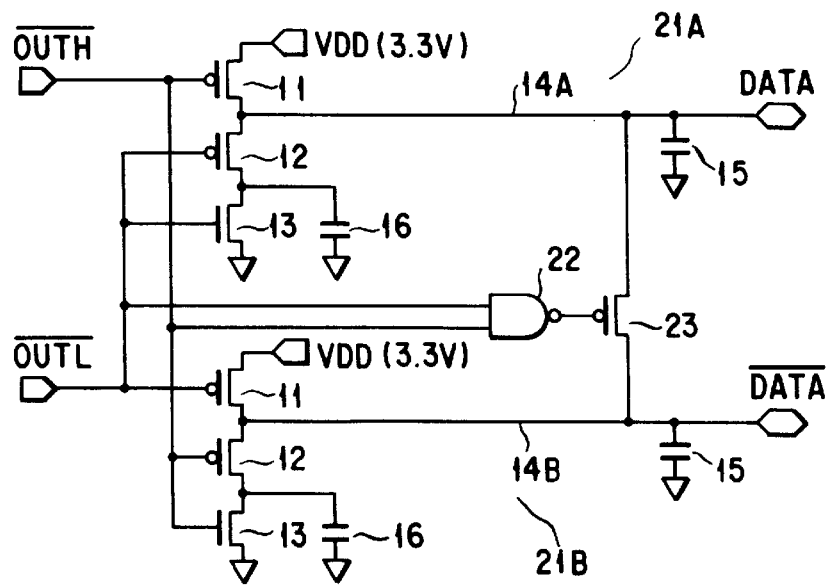
FIG. 7 is a circuit diagram showing a circuit arrangement according to the fourth embodiment in which a driving circuit of the present invention is used in the output circuit of an SRAM.

FIG. 7 shows a circuit arrangement according to the fourth embodiment in which a driving circuit of the present invention is used in the output circuit of an SRAM. In the output circuit of this embodiment, complementary signals are output to a pair of data buses 14A and 14B, and simultaneously, the data buses 14A and 14B are short-circuited at the start of each cycle for setting the signals of the data buses 14A and 14B, thereby further reducing the power consumption.

The output circuit of this embodiment uses two output circuits according to the first embodiment shown in FIG. 1. More specifically, each of an output circuit 21A for driving one data bus 14A and an output circuit 21B for driving the other data bus 14B has two p-channel MOS transistors 11 and 12, one n-channel MOS transistor 13, and a dummy capacitance 16.

One signal $\overline{OUTH}$ is supplied to the gate of the p-channel MOS transistor 11 in the output circuit 21A and the gates of the p-channel MOS transistor 12 and the n-channel MOS transistor 13 in the output circuit 21B. The other signal $\overline{OUTL}$ is supplied to the gate of the p-channel MOS transistor 11 in the output circuit 21B and the gates of the p-channel MOS transistor 12 and the n-channel MOS transistor 13 in the output circuit 21A. One signal $\overline{OUTH}$ goes "L" in outputting a signal of "H" to one data bus 14A while the other signal $\overline{OUTL}$ goes to "L" in outputting a signal of "H" to the other data bus 14B.

The output circuit of this embodiment also has a NAND gate 22 and a p-channel MOS transistor 23. The signals $\overline{OUTH}$ and $\overline{OUTL}$ are supplied to the NAND gate 22. The output signal from the NAND gate 22 is supplied to the gate of the MOS transistor 23. The source-drain path of the MOS transistor 23 is connected between one data bus 14A and the other data bus 14B.

Figure 8:
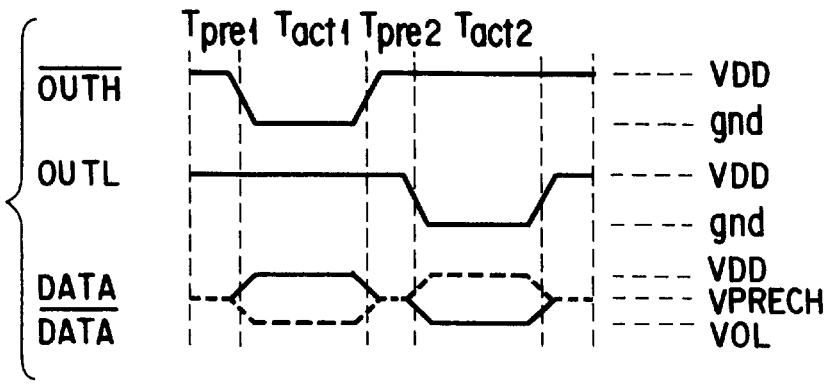
FIG. 8 is a timing chart showing the operation of the output circuit shown in FIG. 7.

The operation of the output circuit having the above arrangement will be described next with reference to a timing chart shown in FIG. 8. FIG. 8 shows waveforms of two cycles. At the start (Tpre1 and Tpre2) of each cycle, both one signal $\overline{OUTH}$ and the other signal $\overline{OUTL}$ go "H" (VDD). At this time, the output signal from the NAND gate 22 goes to "L" (GND) to turn on the p-channel MOS transistor 23. One data bus 14A and the other data bus 14B are short-circuited, so the two data buses are set at an equipotential. On the basis of the rule of charge distribution, a potential VPRECH of the data buses is given by:

$$VPRECH = VDD \times (CBUS + Cdummy)/(CBUS + 2Cdummy) \quad (8)$$

Assuming that VDD is 3.3 V, CBUS is 1 pF, and Cdummy is 0.1 pF, i.e., the dummy capacitance 16 is roughly 1/10 the parasitic capacitance 15, equation (8) can be rewritten to equation (9):

$$VPRECH = 3.3 \times (1 + 0.1)/(1 + 2 \times 0.1)$$

$$= 3.025 (V) \quad (9)$$

At Tact, one signal $\overline{OUTH}$ goes "L" to turn on the p-channel MOS transistor 11 in the output circuit 21A, so the potential of one data bus 14A is VDD. Simultaneously, the p-channel MOS transistor 12 in the output circuit 21B is turned on to connect the other data bus 14B to the dummy capacitance 16. From the rule of charge distribution, a potential VOL of the data bus 14B connected to the dummy capacitance 16 is given by:

$$VOL = 3.3 \times 0.1/(1 + 2 \times 0.1) \quad (10)$$

VOL given by equation (10) above is the "L"-side potential of the data bus. Substitutions of VDD=3.3 V, CBUS=1 pF, and Cdummy=0.1 pF into equation (10) yield:

$$VOL = 3.3 \times 0.1/(1 + 2 \times 0.1)$$

$$= 2.75 (V) \quad (11)$$

When the other signal $\overline{OUTL}$ goes "L" at Tact2, the p-channel MOS transistor 11 in the output circuit 21B is turned on, so the other data bus 14B is set at VDD. At this time, the p-channel MOS transistor 12 in the output circuit 21A is turned on, so the potential of one data bus 14A is VOL.

In this embodiment, the complementary data buses are short-circuited at the start of each cycle. With this arrangement, the amplitude on the data bus can be increased while holding low power consumption. Reversely, if the amplitude on the data bus is decreased as in the previous embodiments, the power consumption can be further reduced.

For example, in the third embodiment shown in FIG. 5, assuming that VDD is 3.3 V, CBUS is 1 pF, and Cdummy is 0.1 pF, the amplitude on the data bus is 3.3 V−3.0 V=0.3 V. Letting the frequency be f (Hz), a power P (W) consumed by the data bus is given by:

$$P = 2f \times CBUS \times 0.3^2 = f \times 0.18 (pW) \quad (12)$$

The power P (W) in the fourth embodiment shown in FIG. 7 is given by:

$$P = 2f \times CBUS \times 0.275^2 = f \times 0.15 (pW) \quad (13)$$

Although the power consumption is smaller than that in the third embodiment, the amplitude on the data bus increases from 0.3 V in the third embodiment to 0.55 V. The large amplitude facilitates determination of "H"/"L" on the signal reception side of the data buses. Therefore, the amplitude is preferably as large as possible unless the power consumption increases.

Figure 9:
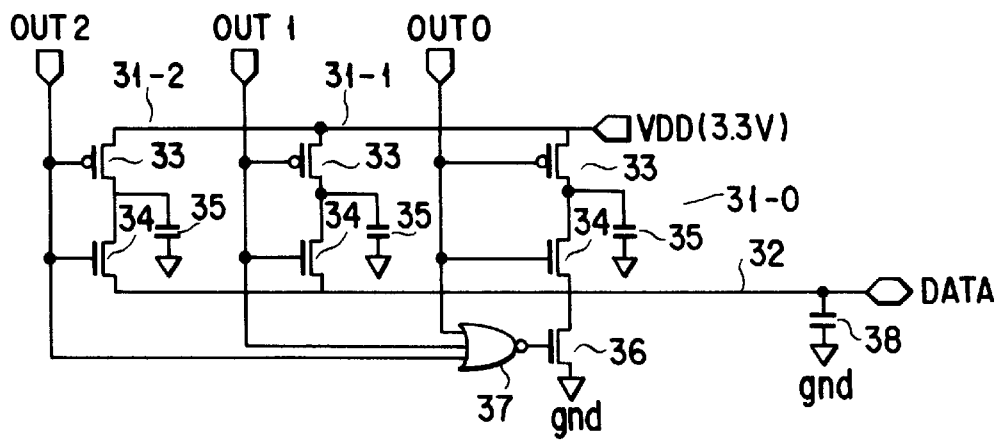
FIG. 9 is a circuit diagram showing a circuit arrangement according to the fifth embodiment in which a driving circuit of the present invention is used in a multivalued logic output circuit.

FIG. 9 shows a circuit arrangement according to the fifth embodiment in which a driving circuit of the present invention is used in a multivalued logic output circuit.

Referring to FIG. 9, as in the above embodiments, reference symbol VDD is a power supply (e.g., 3.3 V) for supplying the "H"-side potential of the data bus; and GND, a power supply of the ground potential (0 V). Reference numerals 31-0, 31-1, and 31-2 denote "H"-side potential setting circuits to which 3-bit driving signals OUT0, OUT1, and OUT2 are supplied, respectively. Each of the "H"-side potential setting/output circuits 31-0 to 31-2 comprises a p-channel MOS transistor 33 and an n-channel MOS transistor 34 whose source-drain paths are connected in series between the power supply VDD and a data bus 32, and a dummy capacitance 35 connected to the series connection point of the MOS transistors 33 and 34. The source-drain path of an n-channel MOS transistor 36 for setting the "L"-side potential of the data bus 32 is connected between the data bus 32 and the power supply GND. The output signal from a NOR gate 37 for receiving the 3-bit driving signals OUT0 to OUT2 is supplied to the gate of the MOS transistor 36. A parasitic capacitance 38 is connected to the data bus 32.

Note that the dummy capacitance 35 can be made using the gate capacitance, junction capacitance, or parasitic capacitance of metal interconnections of a MOS transistor. When the value of the dummy capacitance 35 in the "H"-side potential setting/output circuit 31-0 is C0, the value of the dummy capacitance 35 in the "H"-side potential setting/output circuit 31-1 is C1, and the value of the dummy capacitance 35 in the "H"-side potential setting/output circuit 31-2 is C2, the following relationship hold among C0, C1, and C2;

$$C0 : C1 : C2 = 1:2:4 \quad (14)$$

The operation of the output circuit having the above arrangement will be described next.

Assume that all the 3-bit driving signals OUT0 to OUT2 are at "L" (GND). The p-channel MOS transistors 33 in the "H"-side potential setting/output circuits 31-0 to 31-2 are turned on, so the dummy capacitances 35 are charged by the power supply VDD. At this time, the output signal from the NOR gate 37 goes "H" to turn on the n-channel MOS transistor 36 for setting the "L"-side potential of the data bus 32. The data bus 32 is connected to the power supply GND, and the parasitic capacitance 38 is discharged to the ground potential.

Next, assume that only the driving signal OUT0 goes "H" (VDD), and the remaining driving signals OUT1 and OUT2 go "L". When the signal OUT0 is at "H", the output signal from the NOR gate 37 goes "L" to turn off the n-channel MOS transistor 36. Since the n-channel MOS transistor 34 in the "H"-side potential setting/output circuit 31-0 is turned on, the dummy capacitance 35 in the "H"-side potential setting/output circuit 31-0 is connected to the data bus 32. From the rule of charge distribution, a potential V ("001") (OUT0="1", OUT1="0", and OUT2="0") of the data bus 32 is given by:

$$V(\text{"001"}) = VDD \times C0/(CBUS+C0) \quad (15)$$

where CBUS is the value of the parasitic capacitance 38.

Substitutions of VDD=3.3 V, CBUS=1 pF, and C0=0.1 pF into equation (15) yield:

$$V(\text{"001"}) = 3.3 \times 0.1/(1+0.1) = 0.3 (V) \quad (16)$$

Assume that all the 3-bit driving signals OUT0 to OUT2 are temporarily set at "L" to connect the data bus to the power supply GND and discharge the parasitic capacitance 38, and next, only the driving signal OUT1 goes "H" while the remaining driving signals OUT0 and OUT2 go "L". When the driving signal OUT1 is at "H", the output signal from the NOR gate 37 goes "L" to turn off the n-channel MOS transistor 36. In addition, the n-channel MOS transistor 34 in the "H"-side potential setting/output circuit 31-1 is turned on, and the dummy capacitance 35 in the "H"-side potential setting/output circuit 31-1 is connected to the data bus 32. On the basis of the rule of charge distribution, the potential V ("010") (OUT0="0", OUT1="1", and OUT2="0") of the data bus 32 is given by:

$$V(\text{"010"}) = VDD \times C1/(CBUS+C1) \quad (17)$$

where CBUS is the value of the parasitic capacitance 38.

Since C1=2C0, equation (18) below can be obtained:

$$V(\text{"010"}) = 2 \times VDD \times C0/(CBUS+2 \times C0) \quad (18)$$

Like the above calculation, substitutions of the respective values into equation (18) yield V ("010")=0.55 V.

Similarly, calculation for all combinations of the 3-bit driving signals OUT0 to OUT2 can be made as follows:

V("000")=0×VDD/10=0.00 (V)
V("001")=1×VDD/11=0.30 (V)
V("010")=2×VDD/12=0.55 (V)
V("011")=3×VDD/13=0.76 (V)
V("100")=4×VDD/14=0.94 (V)
V("101")=5×VDD/15=1.10 (V)
V("110")=6×VDD/16=1.24 (V)
V("111")=7×VDD/17=1.36 (V)

When the potential of the data bus 32 is to be changed from a value other than 0 V to another value other than 0 V, all the 3-bit driving signals OUT0 to OUT2 must be temporarily set at "L" to set the data bus at 0 V in advance.

As described above, in the output circuit of this embodiment, potentials of eight levels can be output onto the data bus 32 on the basis of combinations of the 3-bit driving signals OUT0 to OUT2. More specifically, according to this embodiment, 3-bit data can be supplied through one data bus by performing D/A (Digital/Analog) conversion without using a plurality of power supplies or a resistance divider.

When the potentials of eight levels output onto the data bus 32 are A/D (Analog/Digital)-converted on the reception side connected to the data bus 32, the 3-bit data can be reconstructed.

In this embodiment, 3-bit driving signals are used. However, as is apparent, this arrangement can be easily realized even with 2 bits or 4 or more bits.

Figure 10:
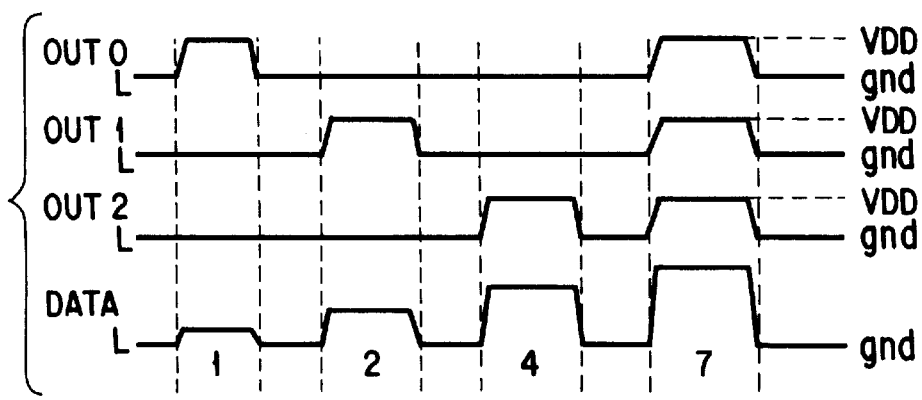
FIG. 10 is a timing chart showing the operation of the output circuit shown in FIG. 9.

FIG. 10 is a timing chart showing the operation of the output circuit shown in FIG. 9. FIG. 11 shows a circuit arrangement according to the sixth embodiment in which a driving circuit of the present invention is used in a multi-valued logic output circuit. FIG. 12 is a timing chart showing the operation of the output circuit shown in FIG. 11.

Referring to FIG. 11, as in the above embodiments, reference symbol VDD denotes a power supply (e.g., 3.3 V) for supplying the "H"-side potential of a data bus; and GND, a power supply (0 V) of the ground potential. References 131-0, 131-1, and 131-2 denote "H"-side potential setting circuits to which 3-bit driving signals OUT0, OUT1, and OUT2 are supplied, respectively. Each of the "H"-side potential setting/output circuits 131-0 to 131-2 comprises a p-channel MOS transistor 133 and an n-channel MOS transistor 134 whose source-drain paths are connected in series between the power supply VDD and a data bus 132, and a dummy capacitance 140, 141, or 142 connected to the series connection point of the MOS transistors 133 and 134. These dummy capacitances change by the power of 2 stepwise. In addition, the source-drain path of an n-channel MOS transistor 139 for setting the "L"-side potential of the data bus 132 is connected between the data bus 132 and the power supply GND. The output signal from a NAND gate 139 for receiving the 3-bit driving signals OUT0 to OUT2 is supplied to the gate of the MOS transistor 136. A parasitic capacitance 138 is connected to the data bus 132.

FIG. 12 is a timing chart showing the operation of this circuit.

Figure 13:
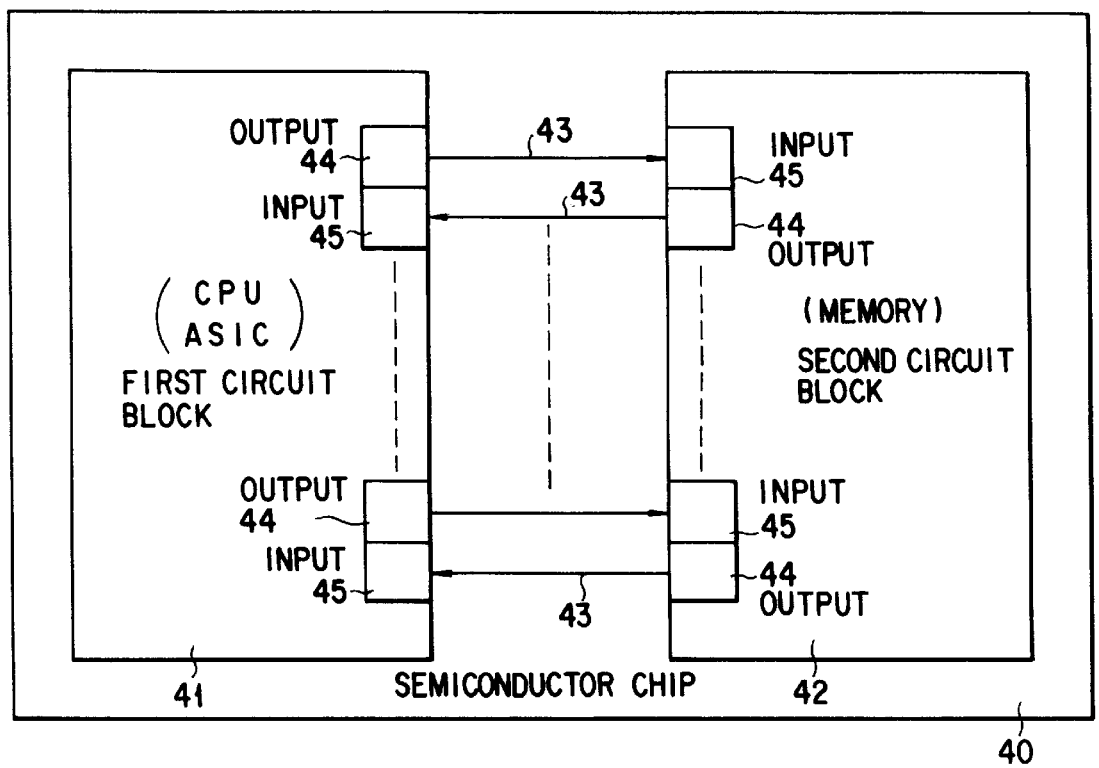
FIG. 13 is a block diagram of a semiconductor integrated circuit according to the seventh embodiment having a driving circuit of the present invention.

FIG. 13 is a block diagram of a semiconductor integrated circuit according to the seventh embodiment, which has a driving circuit of the present invention.

In the semiconductor integrate circuit of this embodiment, reference numeral 40 denotes a semiconductor chip having a first circuit block 41 comprising an ASIC or a CPU, and a second circuit block 42 comprising, e.g., a memory for transmitting/receiving a signal to/from the first circuit block 41. The first circuit block 41 and the second circuit block 42 are connected by a plurality of signal lines 43 such as data and address buses. Each of the first circuit block 41 and the second circuit block 42 has a plurality of output circuits 44 for outputting data or an address and a plurality of input circuits 45 for receiving data or an address. Each output circuit 44 in the first circuit block 41 and second circuit block 42 has the arrangement shown in FIGS. 1, 3, 5, or 7.

According to the semiconductor integrated circuit having such an arrangement, the amplitude of each signal line 43 which receives the output from a corresponding one of the output circuits 44 provided in the first and second circuit blocks 41 and 42 can be made small, a high-speed operation can be realized. This semiconductor integrated circuit also has the characteristic features of the output circuits shown in FIGS. 1, 3, 5, and 7: power consumption of each signal line 43 (data bus) can be reduced, and the chip size and power consumption of an integrated circuit can be reduced.

FIG. 14 is a circuit diagram showing an arrangement example of the input circuit 45 having the signal line 43 made of a pair of data buses in the embodiment shown in FIG. 13.

The source-drain paths of n-channel MOS transistors 52A and 52B serving as switches ON/OFF-controlled by a control signal $\overline{PASS}$ are inserted between a pair of data buses 43A and 43B and a pair of nodes 51A and 51B for receiving internal signals OUT and $\overline{OUT}$, respectively. The source-drain path of an n-channel MOS transistor 53 for equalization, which is ON/OFF-controlled by a control signal $\overline{EQL}$, is inserted between the pair of nodes 51A and 51B. And MOS transistor 60A and 60B are formed between VDD and nodes 51A and 51B.

In addition, a sense amplifier 59 comprising p-channel MOS transistors 54 and 55 and n-channel MOS transistors 56, 57, and 58 is arranged between the pair of nodes 51A and 51B. This sense amplifier 59 is activated when a drive control signal DRIVE to be supplied to the gate of the n-channel MOS transistor 58 goes "H", thereby amplifying the potential difference between the pair of nodes 51A and 51B.

Figure 15:
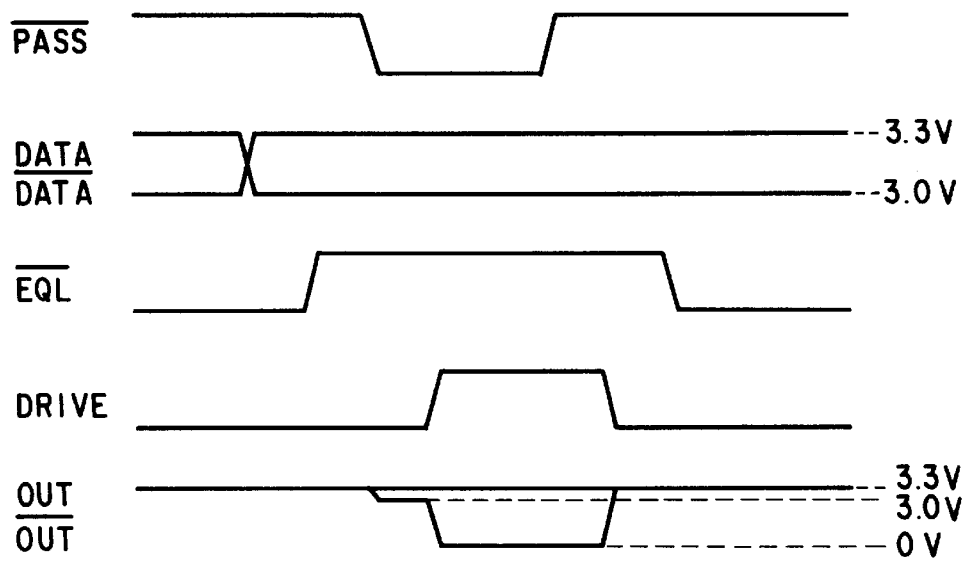
FIG. 15 is a timing chart showing the operation of the input circuit shown in FIG. 14.

The operation of the input circuit having this arrangement will be described using a timing chart shown in FIG. 15. The control signal $\overline{EQL}$ goes "L" to turn on the n-channel MOS transistor 53 for equalization, so that the pair of nodes 51A and 51B are set at an equipotential (equalized). The pair of nodes 51A and 51B are set at VDD (3.3 V) by the p-channel transistor 60A and 60B for charge in advance. For this reason, the pair of nodes 51A and 51B are set at VDD (3.3 V) upon equalizing.

After the control signal $\overline{EQL}$ goes "H", the control signal $\overline{PASS}$ goes "L". Then, the n-channel MOS transistors 52A and 52B as switches are turned, and signals on the pair of data buses 43A and 43B, each of which has a small amplitude (e.g., an amplitude of 0.3 V for an "H"-side potential of 3.3 V and a "L"-side potential of 3.0 V, as shown in FIG. 15), are transmitted to the pair of nodes 51A and 51B, respectively. Next, the drive control signal DRIVE goes "H". The sense amplifier 59 is activated to amplify the signals having small amplitudes, which have been transmitted to the pair of nodes 51A and 51B, to signals having a potential difference between VDD (3.3 V) and GND (0 V).

Figure 16:
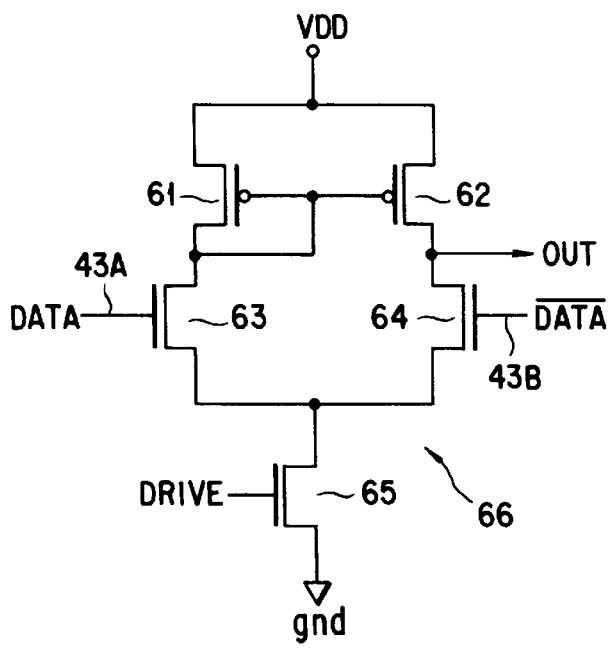
FIG. 16 is a circuit diagram showing another arrangement example of the input circuit of the semiconductor integrated circuit of the embodiment shown in FIG. 13.

FIG. 16 is a circuit diagram showing another arrangement example of the input circuit 45 having the signal line 43 made of a pair of data buses in the embodiment shown in FIG. 13.

Figure 17:
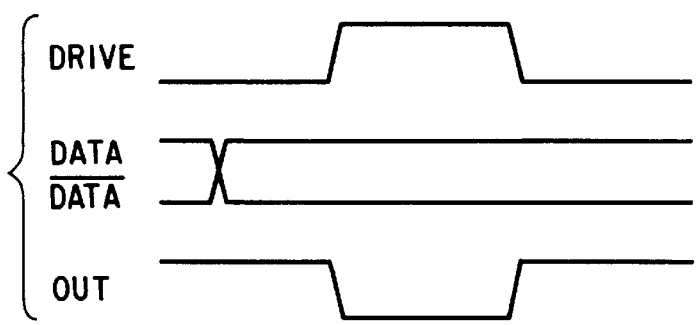
FIG. 17 is a timing chart showing the operation of the input circuit shown in FIG. 16.
Figure 18:
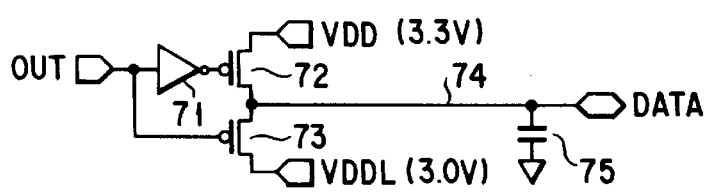
FIG. 18 is an equivalent circuit diagram of the conventional data bus driving circuit of an SRAM.
Figure 19:
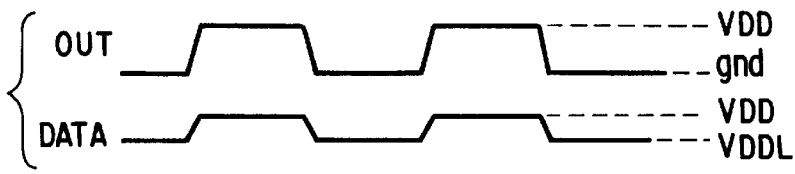
FIG. 19 is a timing chart showing the operation of the data bus driving circuit shown in FIG. 18.

This input circuit comprises two p-channel MOS transistors 61 and 62 and three n-channel MOS transistors 63, 64, and 65. The pair of data buses 43A and 43B are connected to the gates of the n-channel MOS transistors 63 and 64, respectively. The drive control signal DRIVE is supplied to the gate of the n-channel MOS transistor 65. More specifically, these MOS transistors 61 to 65 make up a differential sense amplifier 66. The differential sense amplifier 66 is activated when the drive control signal DRIVE to be supplied to the gate of the n-channel MOS transistor 65 goes "H", thereby amplifying the potential difference between the pair of nodes 51A and 51B. FIG. 17 is a timing chart showing this operation.

As has been described above, according to the present invention, a driving circuit and semiconductor integrated circuit capable of minimizing the amplitude on the signal line and reducing the chip size and current consumption of the integrated circuit can be provided.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A data transmitter circuit comprising:
   a reception line for receiving a logic signal comprising a first logic signal and a second logic signal having a logic level opposite to the first logic signal; and an output circuit, connected to a power supply potential and a ground potential, to output one of the power supply potential and the ground potential when the logic signal received from said reception line is the first logic signal, and an output charge insulated from the power supply potential and the ground potential when the logic signal is the second logic signal.

2. A circuit according to claim 1, wherein the output circuit includes a circuit of setting said reception line at a potential higher than the ground potential and lower than the power supply potential when said reception line is to output the charges insulated from the power supply potential and the ground potential.

3. A circuit according to claim 1, wherein said output circuit includes:

an inverter circuit for inverting the logic signal received from said reception line to generate an inverted signal;

a first switching device having a first conductive path whose one terminal is connected to the power supply potential to open/close the first conductive path in accordance with the inverted signal received from said inverter circuit;

a second switching device having a second conductive path whose one terminal is connected to the other terminal of the first conductive path to open/close the second conductive path in accordance with the logic signal received from said reception line;

a third switching device having a third conductive path whose one terminal is connected to the other terminal of the second conductive path and whose other terminal is connected to the ground potential to open/close the third conductive path in accordance with the first logic signal and the second logic signal received from said reception line;

an output line connected to the other terminal of the first conductive path of said first switching device;

a first capacitance having one terminal connected to said output line and the other terminal connected to the ground potential; and a second capacitance having one terminal connected to the ground potential and the other terminal connected to the other terminal of the second conductive path of said second switching device.

4. A circuit according to claim 1, wherein said output circuit includes:

an inverter circuit for inverting the logic signal received from said reception line to generate an inverted signal;

a first switching device having a first conductive path whose one terminal is connected to the power supply potential to open/close the first conductive path in accordance with the logic signal received from said reception line;

a second switching device having a second conductive path whose one terminal is connected to the other terminal of the first conductive path to open/close the second conductive path in accordance with the logic signal received from said reception line;

a third switching device having a third conductive path whose one terminal is connected to the other terminal of the second conductive path and whose other terminal is connected to the ground potential to open/close the third conductive path in accordance with the inverted signal received from said inverter circuit;

an output line connected to the other terminal of the second conductive path of said second switching device;

a first capacitance having one terminal connected to the other terminal of said first switching device and the other terminal connected to the ground potential; and a second capacitance having one terminal connected to the other terminal of the second conductive path and the other terminal connected to the ground potential.

5. A circuit according to claim 1, wherein said output circuit includes:

an inverter circuit for inverting the logic signal received from said reception line to generate an inverted signal;

a first switching device having a first conductive path whose one terminal is connected to the power supply potential to open/close the first conductive path in accordance with the inverted signal received from said inverter circuit;

a second switching device having a second conductive path whose one terminal is connected to the other terminal of the first conductive path to open/close the second conductive path in accordance with the logic signal received from said reception line;

a third switching device having a third conductive path whose one terminal is connected to the other terminal of the second conductive path and whose other terminal is connected to the ground potential to open/close the third conductive path in accordance with the first logic signal and the second logic signal received from said reception line;

a first output line connected to the other terminal of the first conductive path of said first switching device;

a first capacitance having one terminal connected to said first output line and the other terminal connected to the ground potential;

a second capacitance having one terminal connected to the ground potential and the other terminal connected to the other terminal of the second conductive path of said second switching device;

a fourth switching device having a fourth conductive path whose one terminal is connected to the power supply potential to open/close the fourth conductive path in accordance with the logic signal received from said reception line;

a fifth switching device having a fifth conductive path whose one terminal is connected to the other terminal of the fourth conductive path to open/close the fifth conductive path in accordance with the inverted signal received from said inverter circuit;

a sixth switching device having a sixth conductive path whose one terminal is connected to the other terminal of the fourth conductive path and whose other terminal is connected to the ground potential to open/close the sixth conductive path in accordance with the inverted signal received from said inverter circuit;

a second output line connected to the other terminal of the fourth conductive path of said fourth switching device;

a third capacitance having one terminal connected to said second output line and the other terminal connected to the ground potential; and a fourth capacitance having one terminal connected to the ground potential and the other terminal connected to the other terminal of the fifth conductive path of said fifth switching device.

6. A data transmitter circuit comprising:

a first reception line for receiving a first logic signal;

a second reception line for receiving a second logic signal as a logic opposite to the first logic signal;

a first switching device having a first conductive path whose one terminal is connected to a power supply potential to open/close the first conductive path in accordance with the first logic signal received from said first reception line;

a second switching device having a second conductive path whose one terminal is connected to the other terminal of the first conductive path to open/close the second conductive path in accordance with the second logic signal received from said second reception line;

a third switching device having a third conductive path whose one terminal is connected to the other terminal of the second conductive path and whose other terminal is connected to a ground potential to open/close the third conductive path in accordance with the second logic signal received from said second reception line;

a first output line connected to the other terminal of the first conductive path of said first switching device;

a first capacitance having one terminal connected to said first output line and the other terminal connected to the ground potential;

a second capacitance having one terminal connected to the ground potential and the other terminal connected to the other terminal of the second conductive path of said second switching device;

a fourth switching device having a fourth conductive path whose one terminal is connected to the power supply potential to open/close the fourth conductive path in accordance with the second logic signal received from said second reception line;

a fifth switching device having a fifth conductive path whose one terminal is connected to the other terminal of the fourth conductive path to open/close the fifth conductive path in accordance with the first logic signal received from said first reception line;

a sixth switching device having a sixth conductive path whose one terminal is connected to the other terminal of the fourth conductive path and whose other terminal is connected to the ground potential to open/close the sixth conductive path in accordance with the first logic signal received from said first reception line;

a second output line connected to the other terminal of the fourth conductive path of said fourth switching device;

a third capacitance having one terminal connected to said second output line and the other terminal connected to the ground potential;

a fourth capacitance having one terminal connected to the ground potential and the other terminal connected to the other terminal of the fifth conductive path of said fifth switching device; and a connection circuit for connecting said first output line to said second output line in accordance with the first logic signal received from said first reception line and the second logic signal received from said second reception line.

7. A data transmitter circuit comprising:

a first complementary transistor having a first current path whose one terminal is connected to a power supply potential, and controlled by a first logic signal;

a second complementary transistor having a second current path whose one terminal is connected to the power supply potential, and controlled by a second logic signal;

a third complementary transistor having a third current path whose one terminal is connected to the power supply potential, and controlled by a third logic signal;

an output line connected to the other terminal of each of said first, second, and third complementary transistors;

a circuit for connecting said output line to a ground potential in accordance with the first logic signal, the second logic signal, and the third logic signal;

a first capacitance arranged between said output line and the ground potential and having a first electrostatic capacitance;

a second capacitance arranged between a halfway point of the first current path and the ground potential and having a second electrostatic capacitance;

a third capacitance arranged between a halfway point of the second current path and the ground potential and having a third electrostatic capacitance; and a fourth capacitance arranged between a halfway point of the third current path and the ground potential and having a fourth electrostatic capacitance.

8. A circuit according to claim 7, wherein the first electrostatic capacitance of said first capacitance is larger than the second electrostatic capacitance of said second capacitance, the second electrostatic capacitance of said second capacitance is larger than the third electrostatic capacitance of said third capacitance, and the third electrostatic capacitance of said third capacitance is larger than the fourth electrostatic capacitance of said fourth capacitance.

9. A circuit according to claim 7, wherein each of the first electrostatic capacitance of said first capacitance, the second electrostatic capacitance of said second capacitance, and the third electrostatic capacitance of said third capacitance is set to be the power of the fourth electrostatic capacitance of said fourth capacitance.

10. A semiconductor chip comprising:

a first circuit block formed on a silicon chip and having a function of outputting a processing result of predetermined electrical processing as a signal comprising a first logic signal and a second logic signal as a logic level opposite to the first logic signal, and an output circuit connected to a power supply potential and a ground potential to output one of the power supply potential and the ground potential when the logic signal is the first logic signal and output charges insulated from the power supply potential and the ground potential when the logic signal is the second logic signal; and a second circuit block formed on said silicon chip and having an input circuit for receiving one of the power supply potential and the ground potential or the insulated charges from said output circuit and converting the received potential into one of the first logic signal and the second logic signal, and a function of performing predetermined processing on the basis of the converted first logic signal or second logic signal.

11. A data transmitter circuit connected to a first potential and a second potential, the data transmitter circuit comprising:

a reception line for receiving an input signal;

an output line for outputting an output signal; and an output circuit connected to the reception line, the output line, and the first and second potentials, the output circuit connecting the output line to the first potential responsive to the input signal being in a first logical state, the output circuit providing a charge insulated from both the first and second potentials to the output line responsive to the input signal being in a second logical state.

12. The data transmitter circuit of claim 11, further including:

a first transistor for selectively connecting the output line to the first potential, the first transistor being connected to the first potential and the output line;

a second transistor connected to the first transistor and the output line, the second transistor having a gate connected to the reception line; and a third transistor connected to the second transistor and the second potential, the third transistor having a gate connected to the reception line.

13. The data transmitter circuit of claim 12, wherein the first potential is a power supply potential and the second potential is a ground potential.

14. The data transmitter circuit of claim 12, wherein the first potential is a ground potential and the second potential is a power supply potential.

15. The data transmitter circuit of claim 12, wherein the first and second transistors are each a p-channel MOS transistor and the third transistor is an n-channel MOS transistor.

16. The data transmitter circuit of claim 15, further including an inverter, the first transistor having a gate connected to the reception line through the inverter.

17. The data transmitter circuit of claim 12, wherein the first and second transistors are each an n-channel MOS transistor and the third transistor is a p-channel MOS transistor.

18. The data transmitter circuit of claim 17, further including an inverter, the first transistor having a gate connected to the reception line through the inverter.

19. The data transmitter circuit of claim 12, further including a capacitor connected between the second potential and a node where the second and third transistors are connected to each other.

* * * * *